(12) United States Patent
Kadu

(10) Patent No.: US 10,223,020 B2
(45) Date of Patent: Mar. 5, 2019

(54) SYSTEM AND METHOD FOR ACHIEVING ATOMICITY IN TERNARY CONTENT-ADDRESSABLE MEMORIES

(71) Applicant: Avago Technologies International Sales Pte. Limited, Singapore (SG)

(72) Inventor: Sachin Prabhakarrao Kadu, Fremont, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 218 days.

(21) Appl. No.: 14/950,963

(22) Filed: Nov. 24, 2015

(65) Prior Publication Data

US 2016/0202932 A1 Jul. 14, 2016

Related U.S. Application Data

(60) Provisional application No. 62/101,272, filed on Jan. 8, 2015.

(51) Int. Cl.
*G06F 3/06* (2006.01)
*G06F 12/0802* (2016.01)
*G11C 15/04* (2006.01)
*G06F 12/0893* (2016.01)

(52) U.S. Cl.
CPC .......... *G06F 3/0638* (2013.01); *G06F 3/0604* (2013.01); *G06F 3/0673* (2013.01); *G06F 12/0802* (2013.01); *G11C 15/04* (2013.01); *G06F 12/0893* (2013.01); *G06F 2212/20* (2013.01); *G06F 2212/60* (2013.01)

(58) Field of Classification Search
CPC .......... G06F 11/00; G06F 11/10; G06F 12/00; G06F 12/02; G06F 12/08; G06F 3/06–3/0689; G06F 2003/0691–2003/0698; G06F 11/1064; G06F 17/30982; H04L 45/7457
See application file for complete search history.

(56) References Cited

U.S. PATENT DOCUMENTS

| | | | | |
|---|---|---|---|---|
| 5,771,010 A * | 6/1998 | Masenas | ................. | G06T 9/005 341/106 |
| 7,747,822 B1 * | 6/2010 | Favor | ................. | G06F 12/0875 711/118 |
| 2003/0227801 A1 * | 12/2003 | Battaglia | ............. | G06F 12/0893 365/200 |
| 2015/0039823 A1 * | 2/2015 | Chen | ................. | G06F 17/30982 711/108 |

* cited by examiner

*Primary Examiner* — Nicholas J Simonetti
(74) *Attorney, Agent, or Firm* — Sterne, Kessler, Goldstein & Fox P.L.L.C.

(57) ABSTRACT

A Ternary Content-Addressable Memory (TCAM) system is disclosed. In the system, writes to the memory are performed over several cycles. In order to ensure full visibility of all entries within the TCAM, a cache memory is provided. At the start of the TCAM write, the cache is written with the contents of the new entry. The cache entry is activated for the period of time that the corresponding entry in the TCAM is deactivated for rewriting. For each input value provided to the system, both the TCAM and the cache are checked for potential matches. The results of these checks are compared at output. In this manner, all entries within the TCAM can maintain full visibility even throughout a write period.

19 Claims, 7 Drawing Sheets

SYSTEM AND METHOD FOR ACHIEVING ATOMICITY IN TERNARY CONTENT-ADDRESSABLE MEMORIES

CROSS-REFERENCE TO RELATED APPLICATION

This application claims the benefit of U.S. Provisional Application No. 62/101,272, filed Jan. 8, 2015, which is incorporated herein by reference in its entirety.

BACKGROUND

Field

The disclosure relates to ternary content-addressable memories (TCAMs), and specifically to increasing the visibility of TCAM cells during data writes.

Related Art

TCAMs are unique from traditional memory structures. Whereas conventional memory structures permit only two storage designations (1/0), TCAMs allow for a third: the "don't care" designation, often represented by an "x". This third designation becomes particularly useful when seeking to identify matches and partial matches to an input value because a single input value can "match" multiple different entries in the TCAM.

In order to effect these designations, a particular TCAM entry is broken into two basic partitions: a key and a mask. The key contains a series of bits on which matches are performed. Thus, the key is often described as the "value" or "data value". The mask, on the other hand, contains a series of bits that designate the bits of the key that must be matched to the corresponding bits of an input value in order to achieve a successful "match." Thus, a mask of 1110 would require the first three bits of an input value to match the first three bits of the key. The "0" in the fourth position of the mask indicates a "don't care" for the fourth bit. For example, the system could determine the values to match regardless of whether their fourth bits match or differ. A key and its corresponding mask are both stored in association with a corresponding index value—the position of the key/mask within the stored list of key/mask pairs (e.g., entries).

In newer TCAM architectures, a "stacked" cell is used in order to optimize power and performance. In the stacked architecture, adjacent storage elements of the ternary cell are stacked over each other, as opposed to the traditional planar layout. In the stacked configuration, the stacked storage elements must be written or read over a single data line. As a result, a write operation of one of the storage elements generally occurs over a very long period, which can cause significant down time for the storage element.

BRIEF DESCRIPTION OF THE DRAWINGS/FIGURES

Embodiments are described with reference to the accompanying drawings. In the drawings, like reference numbers indicate identical or functionally similar elements. Additionally, the left most digit(s) of a reference number identifies the drawing in which the reference number first appears.

DETAILED DESCRIPTION

Figure 1:
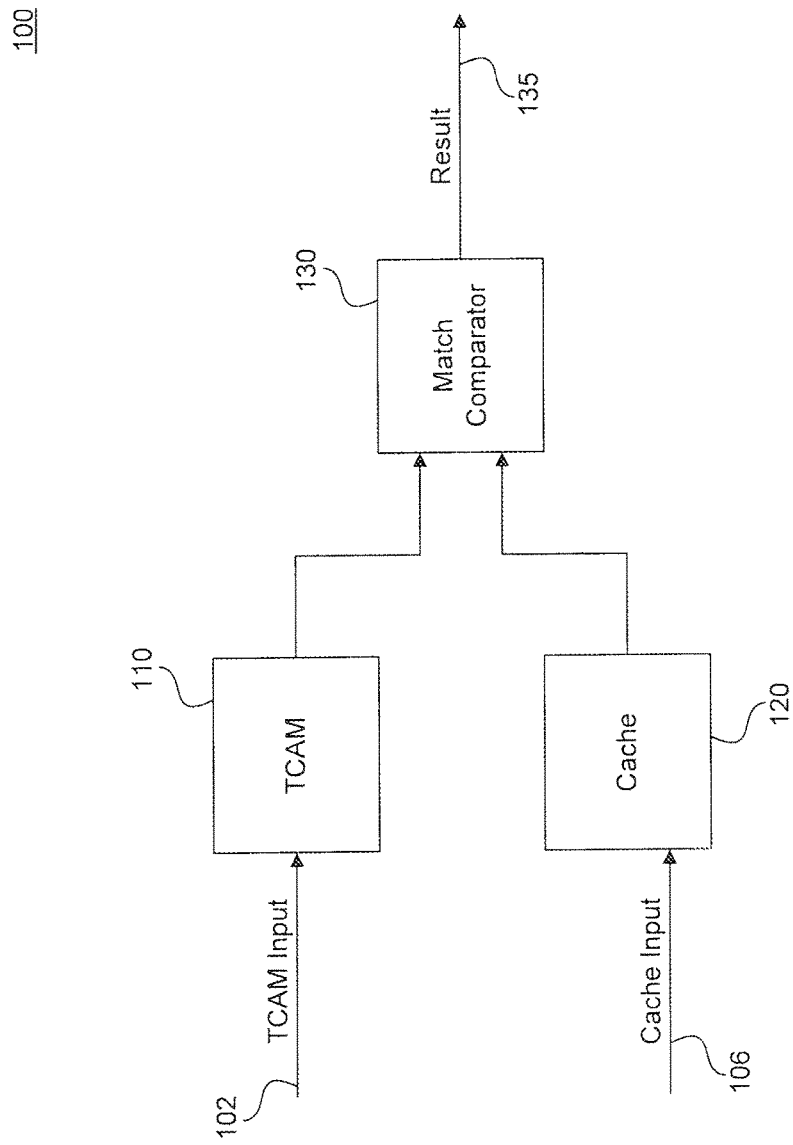
FIG. 1 illustrates an exemplary block diagram of a TCAM system.

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer, as described below.

For purposes of this discussion, the term "module" shall be understood to include at least one of software, firmware, and hardware (such as one or more circuit, microchip, processor, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Those skilled in the relevant art(s) will recognize that this description may be applicable to many various wireless systems, and should not be limited to small/femto cells.

An Exemplary TCAM Writing System

FIG. 1 illustrates an exemplary block diagram of a TCAM system 100. The system 100 includes a TCAM 110 that operates in conjunction with a cache 120. The cache can be any suitable memory structure that can employ, for example, the use of flip-flops as storage elements and be loaded with data in a single clock cycle.

A TCAM input 102 is input to the TCAM 110, and is used for writing information, such as data and/or masks, to the TCAM 110 as well as providing input values, such as port values included within data packets, that are to be compared to the entries within the TCAM 110 and cache 120, as discussed in further detail below. Similarly, a cache input 106 is input to the cache 120, and is used for writing information, such as data and/or masks, to the cache 120, as discussed in further detail below. Although illustrated as separate and distinct lines, in an embodiment, the TCAM input 102 and the cache input 106 share a common input line.

The TCAM 110 and the cache 120 each provide outputs to a match comparator 130, which determines whether the input value matched any of the entries in the TCAM 110 and the cache 120, and outputs the result 135 having the highest priority.

In the stacked TCAM configuration, as discussed above, a write to a single storage element within one of the TCAM cells requires three write cycles. However, these three write cycles are not sequential, and can be spaced over several hundreds or thousands of clock cycles. Further, as part of the writing process, a particular TCAM entry to be edited is deactivated in the first write cycle and is not reactivated until the third write cycle. As a result, a particular TCAM entry becomes "invisible" for the entire write period. This is undesirable behavior for a number of reasons.

In order to eliminate the down time for entries affected by a write, the cache 120 is provided in an embodiment of the disclosure. As will be discussed in further detail below, the cache 120 operates in parallel to the TCAM 110 and is capable of being edited (or updated) significantly faster than the TCAM 110. When an entry in the TCAM 110 is to be invalidated, the new entry is placed in the cache 120, and remains active in the cache 120 until the corresponding entry in the TCAM 110 is updated and reactivated. By checking input values against both the TCAM 110 and the cache 120, all of the entries in the TCAM 110 appear to be visible at all times. Accordingly, updates to the TCAM entries appear to be immediately visible.

The functionality of this configuration and several of its various modifications and uses are discussed in further detail below.

Exemplary TCAM Writing Methods

Figure 2A:
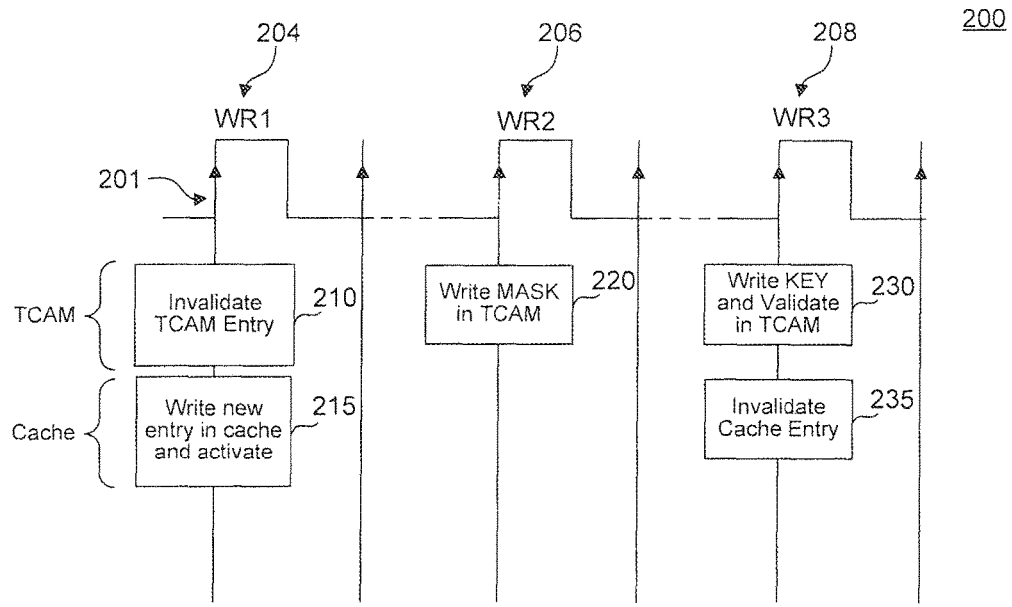
FIG. 2A illustrates an exemplary timing diagram of a method for performing a write for an individual TCAM.

FIG. 2A illustrates an exemplary timing diagram of a method 200 for performing a write for an individual TCAM. For purposes of this discussion, the method 200 will be described with reference to the TCAM system 100.

As shown in FIG. 2A, the system 100 is controlled by a clock signal 201. Operations within the system occur at various cycles of the clock signal 201. As discussed above, a write to the TCAM 110 requires three write cycles: WR1 204, WR2 206, and WR3 208. Each of these write cycles may be separated from the next by several hundreds or thousands of clock cycles.

During the first write cycle WR1 204, one operation occurs in the TCAM 110 and one operation occurs in the cache 120. Specifically, in the TCAM 110, the entry that is to be edited/written is invalidated (210). On the same clock cycle, the cache 120 is written with the updated (new) TCAM entry (215) (including both the key and the mask) together with its corresponding index. Additionally, the cache entry is activated so as to become visible. Once this cycle is complete, even though the entry that is to be edited in the TCAM 110 has been deactivated in the TCAM 110, the edited TCAM entry is active in the cache 120. This is because, unlike the TCAM 110, the cache 120 is composed of flops or similar storage elements that allow for immediate or near-immediate write operations.

System operation continues until the second write cycle WR2 206. During the second write cycle WR2 206, the system 100 updates the mask of the TCAM entry in the TCAM 110 (220). System operation again continues until the third and final write cycle WR3 208. During the third write cycle WR3 208, the system again performs one operation in the TCAM 110 and one operation in the cache 120. In the TCAM 110, the updated key value is written and the entry is validated (230). During the same clock cycle, the corresponding cache entry is invalidated (235). After the conclusion of the third write cycle WR3, the TCAM 110 has been successfully updated while maintaining complete visibility of the edited entry.

Figure 2B:
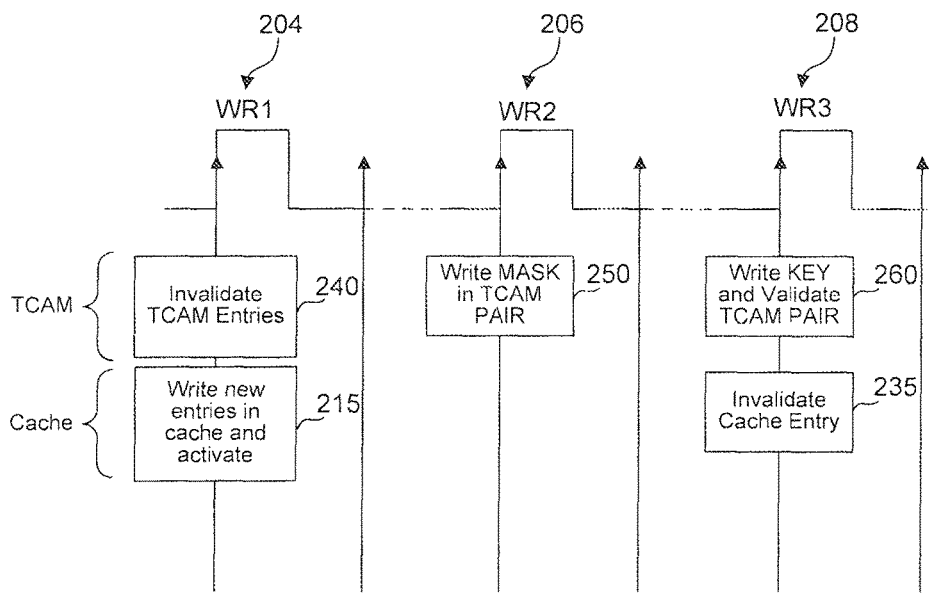
FIG. 2B illustrates an exemplary timing diagram of a method for performing a write for a pair of paired TCAMs.

FIG. 2B illustrates an exemplary timing diagram of a method 200 for performing a write for paired TCAMs in a second embodiment. In this embodiment, the TCAM 110 can be paired with another TCAM 110. This paired TCAM configuration is commonly referred to as "pair mode" and is well-known in the art.

As shown in FIG. 2B, the write operation again requires three write cycles to perform the write. However, in this configuration, during the first write cycle WR1 204, a particular TCAM pair entry is invalidated (240) while the new TCAM entry is written to the cache 120 (215). During the second write cycle WR2 206, the mask is written in the TCAM pair (250). Lastly, in the third write cycle WR3 208, the TCAM pair is updated with the key and is validated (260). At the same time, the corresponding entry in the cache is invalidated (235). In this manner, a write method can be carried out for a pair mode TCAM that maintains entry visibility.

In accordance with the above discussion, there are multiple instances of more than one action occurring during a same clock cycle. However, it should be understood that this is not a requirement. For example, the cache can be written and activated (215) before or after the invalidation of the corresponding TCAM entry (210), i.e. at least one clock cycle before TCAM invalidation. In this instance, it is preferred that the cache 215 entry be activated before the invalidation of the TCAM entry (210) in order to maintain full visibility of the entry. Similarly, steps 230 and 235 can also occur at different clock cycles, but it is preferred that the cache is not invalidated (235) until after the TCAM entry has been validated (230) in order to maintain full visibility of the entry.

Exemplary TCAM Comparisons

Figure 3A:
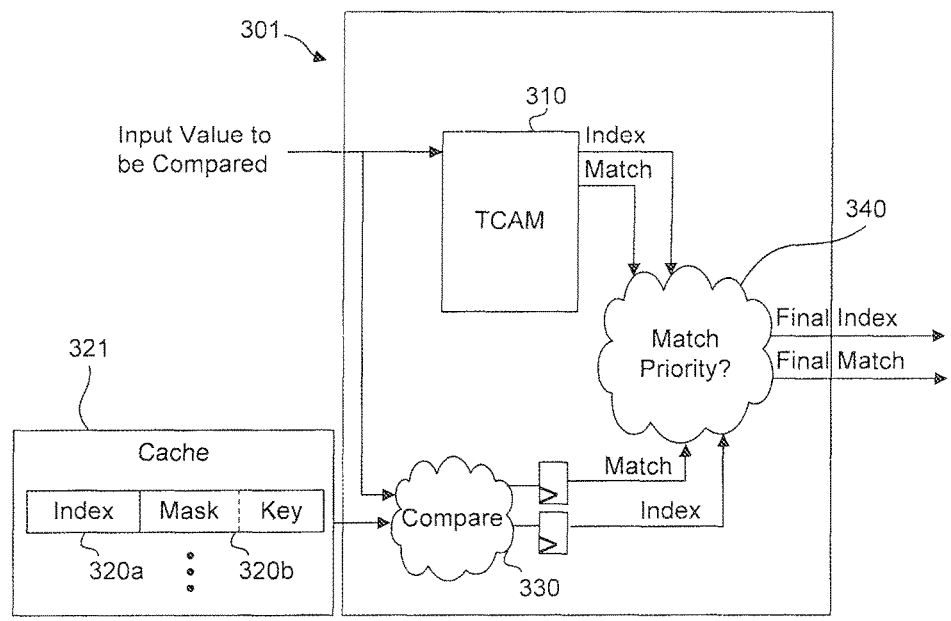
FIG. 3A illustrates an exemplary TCAM module according to a first embodiment.

FIG. 3A illustrates an exemplary TCAM module 301 according to a first embodiment. In this embodiment, an output is only generated when a match is found.

The TCAM module 301 includes a TCAM 310 that receives, as an input, an input value (or key value) to be compared to the entries stored in the TCAM 310. The input value is also sent to a COMPARE logic block 330 that is connected to a cache 321. The cache 321 includes a mask/key combination 320b stored in correspondence with an index 320a. The combination of the key, the mask, and the index correspond to an updated entry in the TCAM 310 that is currently undergoing a write process.

When an input value is received, the input value is forwarded to both the TCAM 310 and the COMPARE logic block 330. In an embodiment, the COMPARE logic block 330 can be configured as an independent entity or as part of a cache module that includes the cache 321. The TCAM 310 and the COMPARE logic block 330 each perform a comparison of the input value. The TCAM 310 compares the input value to the entries that are stored and active within the TCAM 310. Similarly, the COMPARE logic block 330 compares the input value to the entries that are stored and active within the cache 321. To do so, the COMPARE logic block 330 compares the input value to each key portion of the values 320 stored in the cache 321 by checking if those bits of the key portion for which its associated mask portion does not indicate are don't cares.

When either or both of the TCAM 310 or the COMPARE 330 finds a match, it outputs an index output that identifies the index of the matched entry, and also outputs a match output that indicates that a match was found at the entry corresponding to the output index value. In an embodiment, the match output is a flag. These outputs are received by a match priority logic block 340 that is configured to determine the entry from among those matched in the TCAM 310 and the cache 321 that has the highest priority.

In an embodiment, the match with the highest priority is determined based on the indexes of the matches. For example, the match that has the lowest index value is determined to have the highest priority. There may exist a scenario in which a match from the cache 321 and a match from the TCAM 310 have the same index value. In this circumstance, the match priority logic block 340 determines the match from the cache 321 to have the highest priority because the match from the cache will be considered to be more "new" (or current) than that from the TCAM 310.

Once the match priority logic block 340 identifies the match that has the highest priority, the match priority logic block 340 outputs the resulting entry and its index value.

Figure 3B:
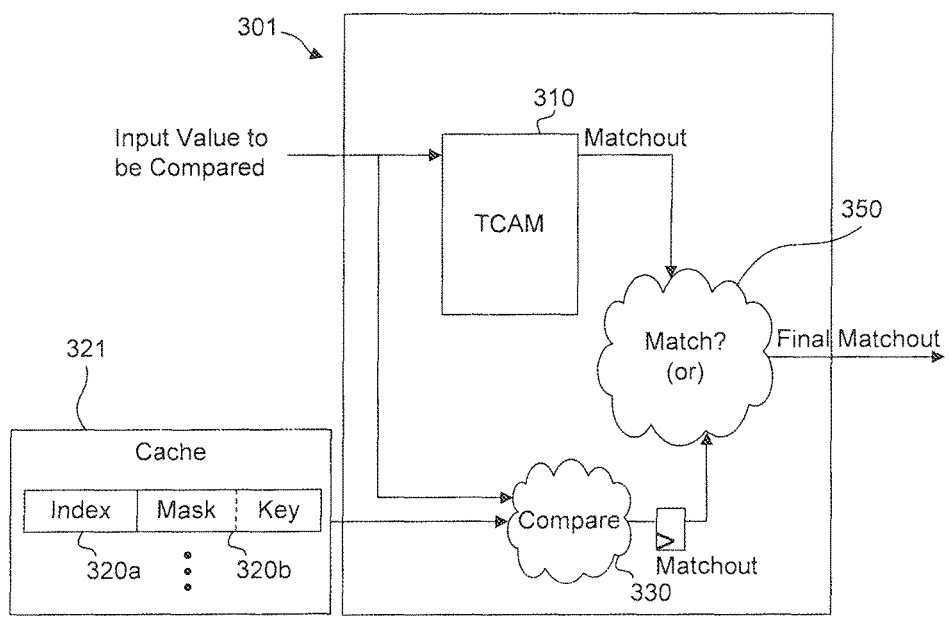
FIG. 3B illustrates an exemplary TCAM module according to a second embodiment.

In another embodiment, the TCAM module 301 can be configured to produce outputs for all entries, indicating for each entry whether a match occurred or did not occur. This embodiment is in contrast to the previous embodiment, in which an output is only generated for the final match with the highest priority. FIG. 3B illustrates an exemplary TCAM module 301 according to the second embodiment.

As shown in FIG. 3B, the TCAM module 301 of the second embodiment is constructed substantially similar to that of the first embodiment. However, the TCAM 310 and the COMPARE logic block 330 do not supply an index value output. Rather, the TCAM 310 and COMPARE logic block 330 only output match flags for the various entries stored therein. In other words, these outputs indicate whether a match occurred for particular indexes known to the system. The match output from the COMPARE logic 330 and the match output from the TCAM 310 are provided to a match logic block 350.

The match logic block 350 determines whether either of the COMPARE logic 330 or the TCAM 310 had a match at the various index values. In an embodiment, this determination can be made by supplying the match outputs received from the TCAM 310 and the cache 321 to OR logic gates, as shown for example in FIG. 3C.

Figure 3C:
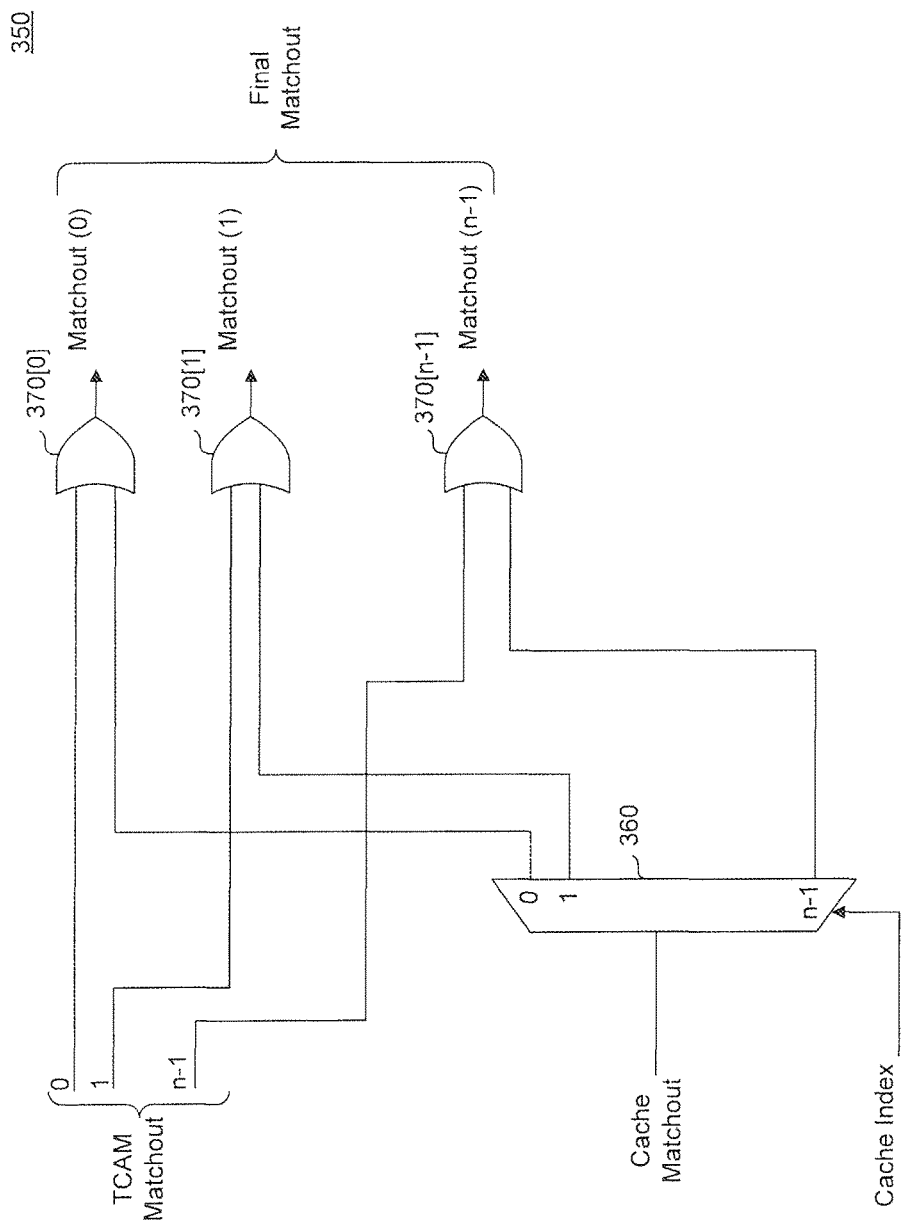
FIG. 3C illustrates an exemplary logic diagram of a match logic block used with the TCAM module of the second embodiment.

FIG. 3C illustrates an exemplary logic diagram of a match logic block 350 used with the TCAM module 301 of the second embodiment. As shown in FIG. 3C, the match logic block 350 receives match flag outputs from the TCAM 310 for each of the TCAM's n entries, where n is a positive integer. Each of the TCAM match flag outputs are provided to a corresponding OR logic gate 370[0]-370[n−1].

The match logic block 350 also includes a demultiplexer 360 connected to the COMPARE logic block 330. The demultiplexer 360 receives the outputs of the COMPARE logic block 330 indicating for a particular cache entry whether a match occurred. The index value of the entry is supplied as a select signal to the demultiplexer 360 for selecting a corresponding OR gate 370.

In an embodiment, the cache may include multiple active entries. In this case, the cache index used to select the demultiplexer 360 outputs can be coordinated with the output of the COMPARE logic block 330 to cycle through all index values in correspondence with the outputs of the COMPARE logic block 330. In this manner, the match results for each of the cache 321 entries can be sequentially supplied to the OR gates 370. Monitoring can be performed at the outputs of the OR gates 370 over the course of this sequencing to determine which of the OR gates 370 flash the occurrence of a match.

In another embodiment, the sequential cycling through the available cache entries can be coupled with flip-flops located between the demultiplexer 360 and the OR gates 370 in order to temporarily store the match results of the cache. By the inclusion of the flip-flops, coordinated monitoring need not be performed at the outputs of the OR gates 370. A reset line can be connected to the flip-flops in order to reset the flip-flops after each cycle of comparisons. In this manner, matches can be properly detected for each consecutive input value without interference from previous input values.

After the match logic block 350 determines the indexes between the TCAM 310 and the cache 321 that produced matches, the match logic block 350 outputs the results as a Final Matchout vector, which includes the Matchout[0]-Matchout[n−1] outputs of the corresponding OR gates 370[0]-370[n−1].

Figure 4:
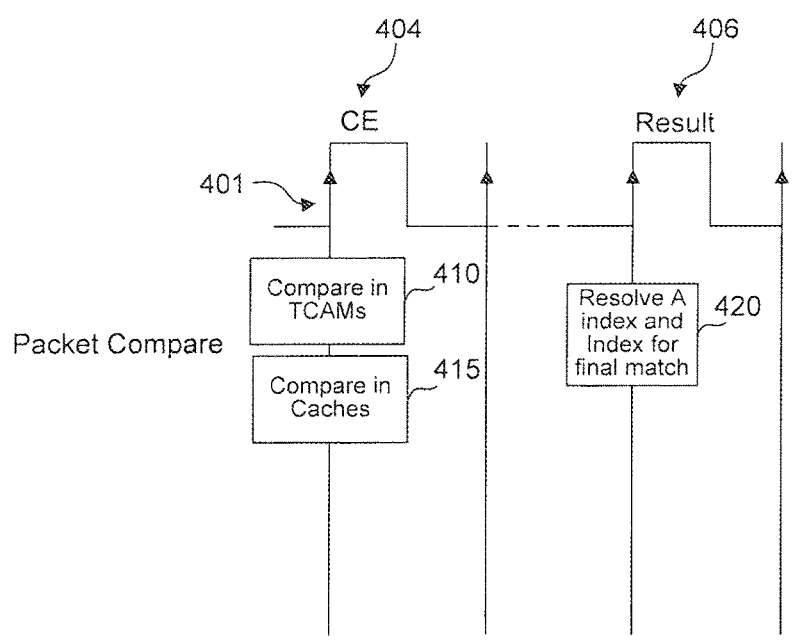
FIG. 4 illustrates an exemplary timing diagram of a method for performing a packet compare.

FIG. 4 illustrates an exemplary timing diagram of a method 400 for performing a packet compare using the exemplary TCAM modules 301 described above.

As described above, the method is performed at various clock cycles of a system clock 401. At a first clock cycle (e.g., a compare clock cycle) CE 404, the received input value is compared to one or more entries in the TCAM 310 (410). During the same clock cycle, the received input value is also compared (or at least started to have been compared)

to one or more entries in the cache 321. Several processing clock cycles may occur thereafter during which the comparisons are being made and a final highest-priority match is determined. At a second clock cycle (e.g., a result clock cycle) 406, the TCAM module 301 resolves the final index for the final match to be output (420).

In accordance with the above discussion, there are multiple instances of more than one action occurring during a same clock cycle. However, it should be understood that this is not a requirement. For example, the received input value can be compared to the one or more entries in the cache (415) before or after the received input value is compared to the one or more entries in the TCAM (410), i.e. at least one clock cycle before or after the received input value is compared to the one or more entries in the TCAM.

High Clock-Frequency TCAM Configuration

With the decrease in feature sizes, the TCAM configurations may not scale successfully for higher clock frequencies. For example, TCAMs that employ the 16 nm and smaller feature sizes may begin to perform inadequately at 850 MHz or more. Therefore, there is also proposed a TCAM solution for maintaining visibility of TCAM entries even at high clock frequencies.

Figure 5A:
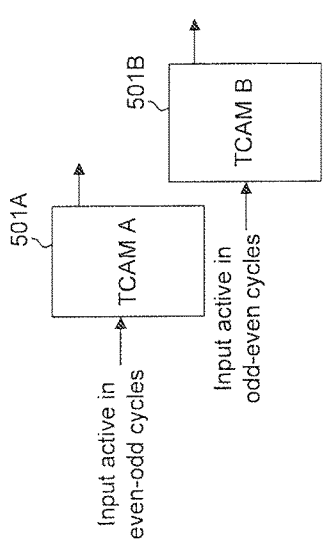
FIG. 5A illustrates a block diagram of an exemplary high-clock frequency TCAM system.

FIG. 5A illustrates a high-level conceptual block diagram of an exemplary high-clock frequency TCAM system 500. In the system 500, two TCAMs are provided: TCAM A 501A and TCAM B 501B. These TCAMs 501 work in tandem to provide the desired functionality, even at high clock frequencies. In this embodiment, the TCAMs 501A and 501B are "twins" of each other. In other words, they each contain the same entries. By configuring the TCAMs 501A and 501B to each only accept inputs during alternating clock cycles, the TCAMs 501A and 501B can provide full functionality and visibility to the TCAM system 500.

Figure 5B:
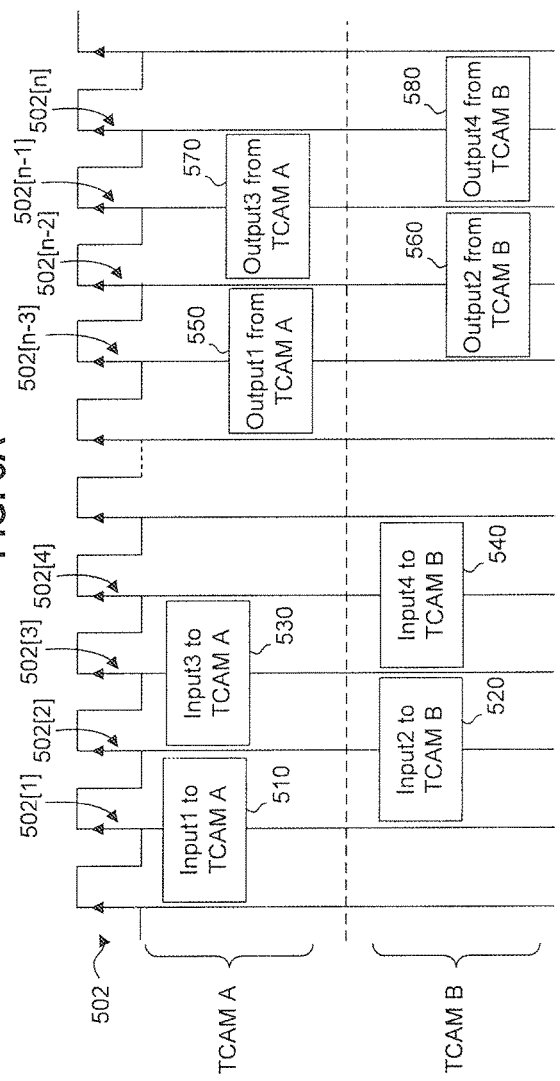
FIG. 5B illustrates an exemplary timing diagram of a method for performing a packet compare in the exemplary high-clock frequency TCAM system.

Writing to the TCAMs can be performed in substantially the same manner as described above with respect to FIGS. 2A and 2B, except that the entry in the cache should not be invalidated until after both corresponding entries in the TCAMs 501A and 501B have been activated. Performing a packet compare in the twinned TCAMs 501A and 501B, however, operates somewhat differently than previously described. FIG. 5B illustrates an exemplary timing diagram of a method for performing a packet compare in the exemplary high-clock frequency TCAM system 500.

Again, as with the other methods, operations in the twinned TCAM system 500 operate at various clock cycles of a system clock 502. As discussed above, TCAM A 501A and TCAM B 501B can be configured to work in tandem by receiving inputs at alternating clock cycles. For example, at a first clock cycle 502[1], TCAM A 501A receives a first input (510). During the next clock cycle 502[2], the TCAM B 501B receives a second input (520). Inputs can continue in this alternating manner even though the individual TCAMs 501 have not finished processing the earlier inputs. For example, during a third clock cycle 502[3], the TCAM A 501A receives a third input (530). During a subsequent fourth clock cycle 502[4], the TCAM B 501B receives a fourth input (540).

As the TCAMs 501 finish processing the inputs, they sequentially output the results of the various comparisons. For example, at an n−3 clock clock cycle 502[n−3], the TCAM A 501A outputs the results of the comparison of the first input (550). During the next clock cycle 502[n−2], the TCAM B 501B outputs the results of the comparison of the second input (560). During the next clock cycle 502[n−1], the TCAM A 501A outputs the comparison results for the third input (570). And during the next clock cycle 502[n], the TCAM B 501B outputs the comparison results for the fourth input (580).

In this manner, even though the frequency of the clock exceeds the allowable frequency of the TCAMs 501, the TCAMs can operate together in order to provide seamless processing. As described above, TCAM performance begins declining at around 850 MHz in some example configurations. Consequently, the above method involving twinned TCAMs will be functional for a clock frequency of up to 1.7 GHz. However, it should be understood that the twinned TCAM system is scalable. For example, for higher frequencies, the system 500 can be modified to include a larger number of TCAMs and increased spacing between acceptable clock cycles for inputs of those TCAMs. For example, providing three TCAMs that each operate every third clock cycle will be functional for a clock frequency of up to 2.55 GHz, and so on.

Figure 6:
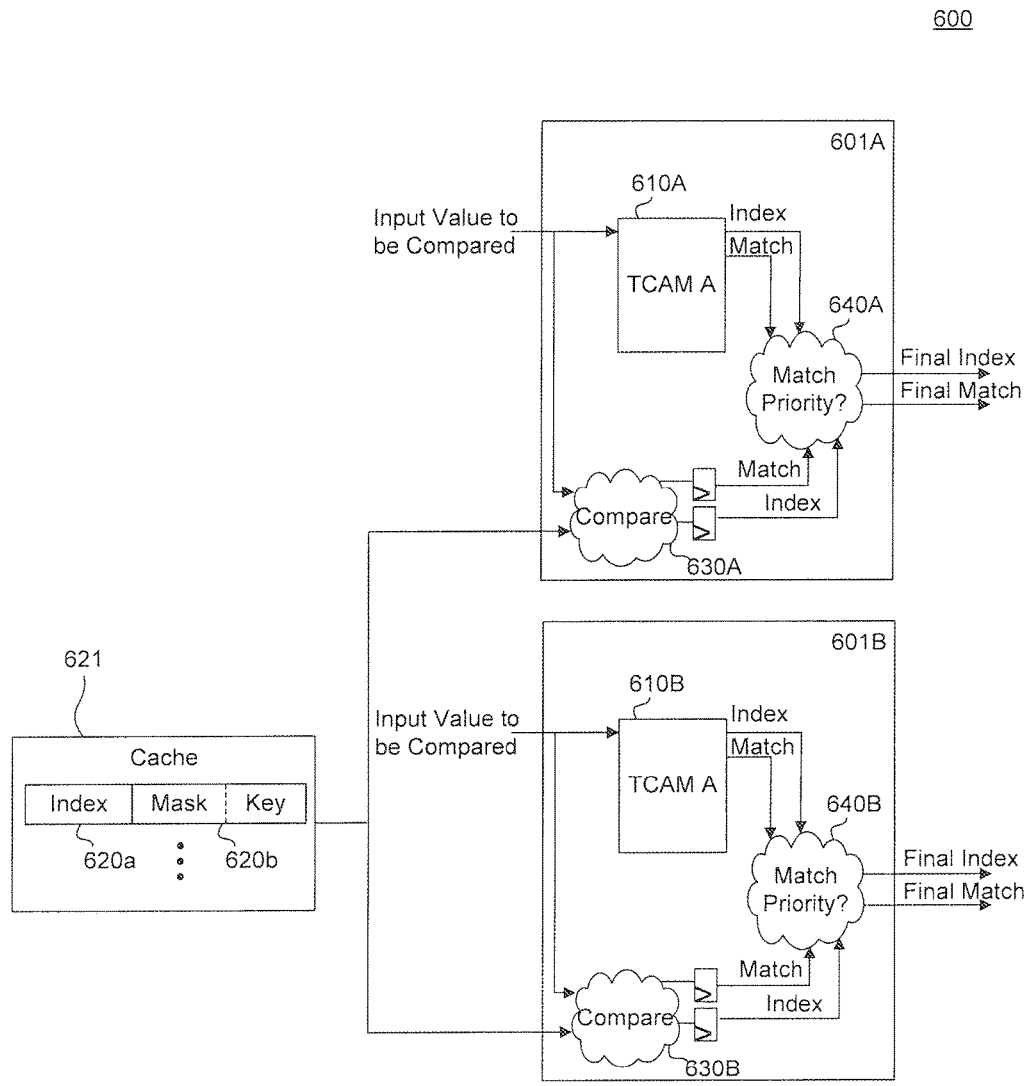
FIG. 6 illustrates a block diagram of an exemplary high-clock frequency TCAM system.

The configuration of the TCAM system 500 will now be described. For example, FIG. 6 illustrates a block diagram of an exemplary high-clock frequency TCAM system 600. The high-frequency TCAM system 600 may represent an exemplary embodiment of the TCAM system 500, and includes a first TCAM module 601A that may represent an exemplary embodiment of the TCAM 501A and a second TCAM module 601B that may represent an exemplary embodiment of the TCAM 501B. The TCAM system 600 also includes a shared cache 621 that includes various entries, each having an index 620a and a mask/key 620b.

Each of the TCAM modules 601A and 601B can be structured in substantially the same as the TCAM module 301. For example, each of the TCAM modules 601A and 601B includes corresponding TCAMs 610A/610B, COMPARE logic blocks 630A/630B, and match logic blocks 640A/640B that operate in accordance with their descriptions above with respect to FIG. 3. Although each of the TCAM modules 601A and 601B are illustrated to output both a match flag and an index value (as in FIG. 3A), each of the TCAM modules 601A and 601B could instead be configured to output only the match flags for each of the TCAM entries (like the configuration illustrated in FIG. 3B).

Data can be written to the TCAMs 610A and 610B in substantially the same manner as described above with respect to a single TCAM, with some small modifications. In particular, when the first write cycle WR1 occurs in the first TCAM 610A, the shared cache 621 is updated with the new entry and corresponding index. Because the TCAMs 610A and 610B must mirror each other, the second TCAM 610B will also need to be updated with the new entry. However, updating the second TCAM 610B will not necessarily conclude on the same clock cycle as the completion of the update to the first TCAM 610A. Therefore, the corresponding new entry in the cache 621 is not deactivated until both the first TCAM 610A and the second TCAM 610B have concluded their respective third write cycles WR3, and have been reactivated.

As discussed above, with this twinned configuration, the TCAM module 601A and the TCAM module 601B receive input values (or input keys) at alternating clock cycles. For example, the TCAM module 601A receives input values at each even clock cycle and the TCAM module 601B receives input values at each odd clock cycle for comparison. During the comparison processing within the TCAM modules 601A/601B, each can also check the shared cache 621 for possible matches in the same manner as previously described.

As previously discussed, although the illustrated twinned configuration is useable for clock frequencies up to approximately 1.7 GHz, additional TCAM modules 601 can be added to the system 600 in order to provide solutions for even faster clock frequencies. In sealed configurations, all TCAM modules 601 will share the same cache 621. In addition, updates to the TCAMs 610 within the TCAM modules 601 will cause the new entry to be placed in the cache 621, and the cached entry will remain active until each of the corresponding entries in all of the TCAMs 610 have been activated.

Other Modifications

In each of the above embodiments, the cache has been illustrated and described as a separate entity. However, in an embodiment, the cache can be included within the TCAM Macro itself. In this embodiment, the TCAM Macro should be modified to receive relevant cache inputs, such as CACHE_OP, $CACHE_{13}$ INDEX_IN, and CACHE_VALID_IN, and also be modified to output relevant cache outputs, such as CACHE_INDEX_OUT, CACHE_VALID_OUT, and CACHE_MATCH_OUT.

CONCLUSION

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Further, the invention should not be limited by any of the above-described exemplary embodiments, but should be defined only in accordance with the following claims and their equivalents.

What is claimed is:

1. A ternary content-addressable memory (TCAM) system, comprising:
   a TCAM module that includes:
      a TCAM having a stacked cell configuration, the TCAM storing a plurality of entries that each include a key and a mask stored in correspondence with an index value, the TCAM being configured to receive an input value and determine at least one match from among the plurality of entries based on a comparison between the input value and the keys of the plurality of entries according to the corresponding masks of the plurality of entries;
      a compare logic block; and
      a match priority logic block; and
   a cache memory that stores a new entry in response to a corresponding entry stored in the TCAM being invalidated,
   wherein the compare logic block is configured to receive the input value and determine whether the input value matches the new entry stored in the cache memory,
   wherein the match priority logic block is configured to determine a final match having a highest priority from among the at least one match, and
   wherein the new entry in the cache memory is invalidated in response to the corresponding entry stored in the TCAM being modified and reactivated.

2. The TCAM system of claim 1, wherein the new entry includes an index value corresponding to the invalidated entry in the TCAM.

3. The TCAM system of claim 1, wherein when the compare logic block determines that the input value matches the new entry stored in the cache memory, the match priority logic block is configured to determine the final match from among the at least one match of the TCAM and the new entry of the cache memory.

4. The TCAM system of claim 1, wherein the match priority logic block is configured to determine the final match based on the index values of the at least one match.

5. The TCAM system of claim 4, wherein the match priority logic block is configured to deter mine the final match as the match of the at least one match having a lowest index value.

6. The TCAM system of claim 1, wherein the new entry in the cache memory is invalidated and the corresponding entry stored in the TCAM is reactivated in a same clock cycle.

7. A ternary content-addressable memory (TCAM) system, comprising:
   a TCAM having a plurality of active entries and a deactivated entry, the TCAM being configured to receive an input value and to determine whether the input value matches any of the plurality of active entries;
   a cache memory that stores an active updated entry corresponding to the deactivated entry in response to deactivation of the deactivated entry in the TCAM; and
   a compare logic block configured to receive the input value and determine whether the input value matches the active updated entry in the cache memory,
   wherein the active updated entry in the cache memory is invalidated in response to the deactivated entry stored in the TCAM being modified and reactivated.

8. The TCAM system of claim 7, wherein each of the plurality of active entries and the deactivated entry in the TCAM include a key and a mask stored in correspondence with a TCAM index value, and
   wherein the active updated entry in the cache memory includes a key and a mask stored in correspondence with a cache index value.

9. The TCAM system of claim 8, wherein the cache index value is the same as the TCAM index value of the deactivated entry in the TCAM.

10. The TCAM system of 7, wherein the compare logic block is configured to output a cache match indicative of a match between the active updated entry in the cache memory and an input value, and wherein the TCAM is configured to output a TCAM match indicative of a match between the input value and at least one of the plurality of active entries in the TCAM.

11. The TCAM system of claim 10, further comprising a match priority logic block configured to receive the cache match from the compare logic block and the TCAM match from the TCAM and to determine a final match from among the cache match and the TCAM match having a highest priority.

12. The TCAM system of claim 7, wherein the TCAM is configured to output a TCAM match flag for each of the plurality of active entries, each TCAM match flag corresponding to one of the plurality of active entries and being indicative of whether the input value matches the corresponding one of the plurality of active entries, and wherein the cache memory is configured to output a cache match flag for the updated active entry indicative of whether the input value matches the updated active entry.

13. The TCAM system of claim 12, further comprising a match logic block configured to output a final match vector based on the TCAM match flags and the cache match flag, the final match vector indicating for each active index value in the TCAM and cache memory whether the input value matched a corresponding entry.

14. The TCAM system of claim 7, wherein the active updated entry in the cache memory is invalidated and the deactivated entry stored in the TCAM is reactivated in a same clock cycle.

15. A method, comprising:
   receiving an input value at a ternary content-addressable memory (TCAM) having a plurality of active entries and a deactivated entry;
   determining whether the input value matches any of the plurality of active entries in the TCAM;
   storing an active updated entry of the deactivated entry in a cache memory in response to deactivation of the deactivated entry in the TCAM;
   determining, by a compare logic block, whether the input value matches the active updated entry in the cache memory; and
   invalidating the active updated entry in the cache memory in response to the deactivated entry stored in the TCAM being modified and reactivated.

16. The method of claim 15, wherein each of the plurality of active entries and the deactivated entry in the TCAM include a key and a mask stored in correspondence with a TCAM index value, and
   wherein the active updated entry in the cache memory includes a key and a mask stored in correspondence with a cache index value.

17. The method of claim 16, wherein the cache index value is the same as the TCAM index value of the deactivated entry in the TCAM.

18. The method of claim 15, further comprising:
   outputting, by the compare logic block, a cache match indicative of a match between the active updated entry in the cache memory and an input value, and
   outputting, by the TCAM, a TCAM match indicative of a match between the input value and at least one of the plurality of active entries in the TCAM.

19. The method of claim 15, wherein the active updated entry in the cache memory is invalidated and the deactivated entry stored in the TCAM is reactivated in a same clock cycle.

* * * * *

UNITED STATES PATENT AND TRADEMARK OFFICE
CERTIFICATE OF CORRECTION

PATENT NO.         : 10,223,020 B2
APPLICATION NO.    : 14/950963
DATED              : March 5, 2019
INVENTOR(S)        : Sachin Prabhakarrao Kadu It is certified that error appears in the above-identified patent and that said Letters Patent is hereby corrected as shown below:

In the Claims

In Column 10, Lines 13-14, Claim 5 replace "wherein the match priority logic block is configured to deter mine" with -- wherein the match priority logic block is configured to determine --.

Signed and Sealed this
Twenty-sixth Day of November, 2019

Andrei Iancu
*Director of the United States Patent and Trademark Office*